(12) United States Patent
Auen et al.

(10) Patent No.: US 10,672,815 B2
(45) Date of Patent: Jun. 2, 2020

(54) SENSOR DEVICE

(71) Applicant: OSRAM OLED GMBH, Regensburg (DE)

(72) Inventors: Karsten Auen, Regensburg (DE); Andreas Wojcik, Regensburg (DE); Hubert Halbritter, Dietfurt (DE); Tim Böscke, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 264 days.

(21) Appl. No.: 15/557,589

(22) PCT Filed: Mar. 17, 2016

(86) PCT No.: PCT/EP2016/055870
§ 371 (c)(1),
(2) Date: Sep. 12, 2017

(87) PCT Pub. No.: WO2016/150826
PCT Pub. Date: Sep. 29, 2016

(65) Prior Publication Data
US 2018/0053801 A1 Feb. 22, 2018

(30) Foreign Application Priority Data
Mar. 20, 2015 (DE) .......... 10 2015 104 208

(51) Int. Cl.
*H01L 27/146* (2006.01)
*G01S 17/89* (2020.01)

(52) U.S. Cl.
CPC ...... *H01L 27/14627* (2013.01); *G01S 17/89* (2013.01); *H01L 27/14605* (2013.01);
(Continued)

(58) Field of Classification Search
CPC combination set(s) only.
See application file for complete search history.

(56) References Cited

U.S. PATENT DOCUMENTS 6,166,854 A    12/2000  Katsuma
6,627,865 B1    9/2003  Hamilton, Jr. et al.
(Continued)

FOREIGN PATENT DOCUMENTS

CN    101689748 A    3/2010
CN    103311256 A    9/2013
(Continued)

*Primary Examiner* — Mamadou L Diallo
(74) *Attorney, Agent, or Firm* — Slater Matsil, LLP

(57) ABSTRACT

A sensor device is disclosed. In an embodiment, the sensor device includes a carrier having a plane carrier surface, a plurality of photodetectors arranged on the carrier surface, each photodetector including a photosensitive sensor area and a lens arrangement arranged opposite the sensor areas, wherein the lens arrangement includes an optical axis, wherein the lens arrangement is configured to image electromagnetic radiation onto the sensor areas, wherein the plurality of photodetectors comprise at least one first photodetector having a first sensor area, the first sensor area comprises at least one property which differs from a property of a second sensor area of a second photodetector of the plurality of photodetectors, and wherein the second photodetector is arranged closer to the optical axis than the at least one first photodetector in order to reduce an optical imaging aberration of the lens arrangement.

17 Claims, 7 Drawing Sheets

(52) U.S. Cl.
CPC .. *H01L 27/14625* (2013.01); *H01L 27/14634* (2013.01); *H01L 27/14629* (2013.01); *H01L 27/14636* (2013.01)

(56) References Cited

U.S. PATENT DOCUMENTS

| | | |
|---|---|---|
| 7,714,437 B2 | 5/2010 | Naya |
| 8,378,287 B2 | 2/2013 | Schemmann et al. |
| 8,692,344 B2 | 4/2014 | Oganesian |
| 2006/0284052 A1 | 12/2006 | Toshikiyo et al. |
| 2009/0115875 A1 | 5/2009 | Choi et al. |
| 2010/0264502 A1 | 10/2010 | Christophersen et al. |
| 2010/0277627 A1 | 11/2010 | Duparre et al. |
| 2012/0026093 A1* | 2/2012 | Duparre ............. G06F 3/03547 345/166 |
| 2012/0050715 A1 | 3/2012 | Krainak |
| 2013/0242155 A1 | 9/2013 | Oganesian |
| 2017/0363465 A1* | 12/2017 | Send ........................ G01C 3/06 |
| 2018/0276843 A1* | 9/2018 | Send ........................ G01C 3/06 |

FOREIGN PATENT DOCUMENTS

| | | |
|---|---|---|
| DE | 102010054078 A1 | 11/2011 |
| EP | 0786815 A1 | 7/1997 |
| JP | 2000036587 A | 2/2000 |
| JP | 2005072041 A | 3/2005 |
| JP | 2009049499 A | 3/2009 |

* cited by examiner

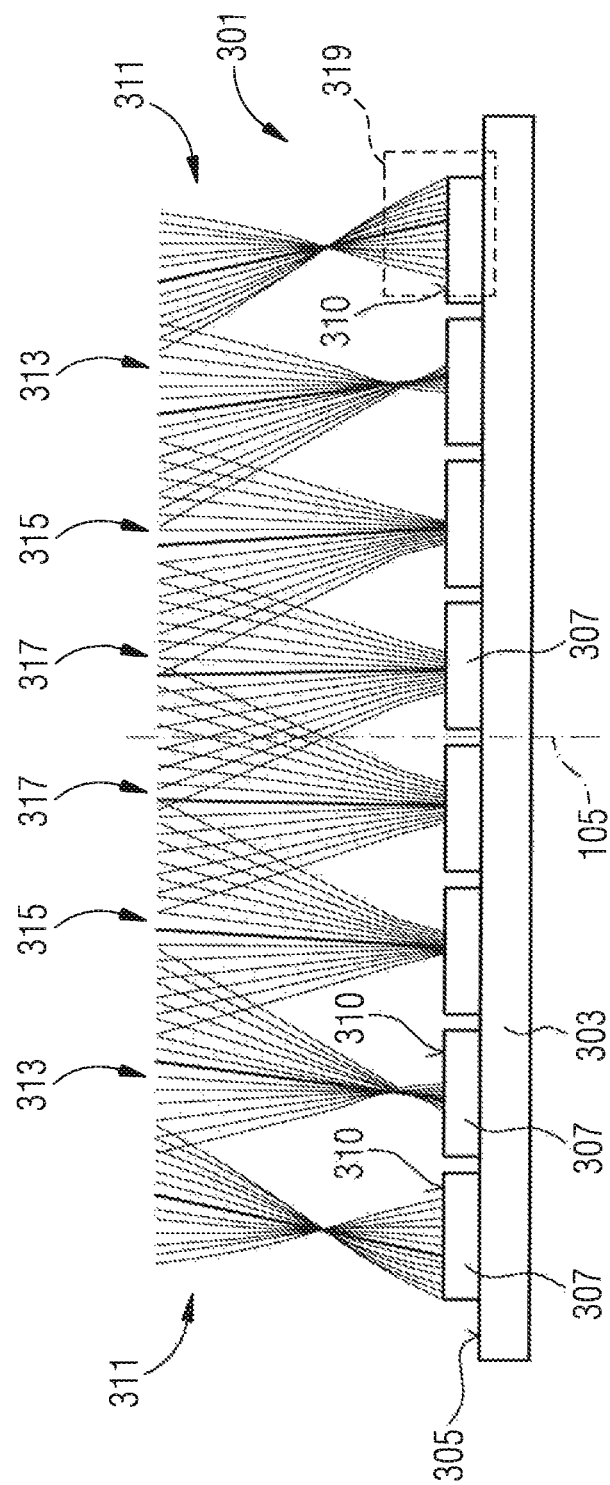
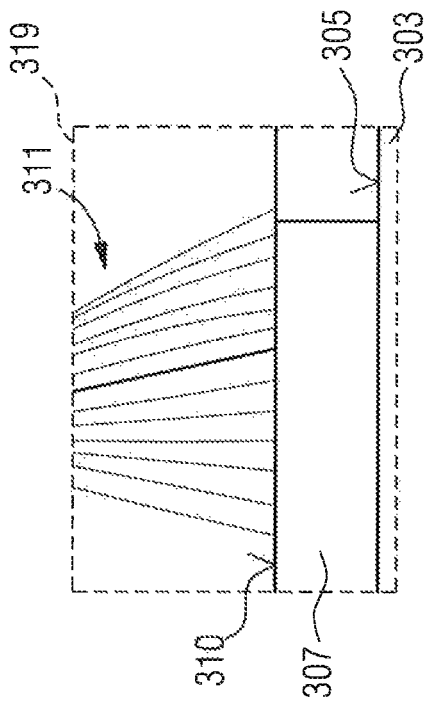

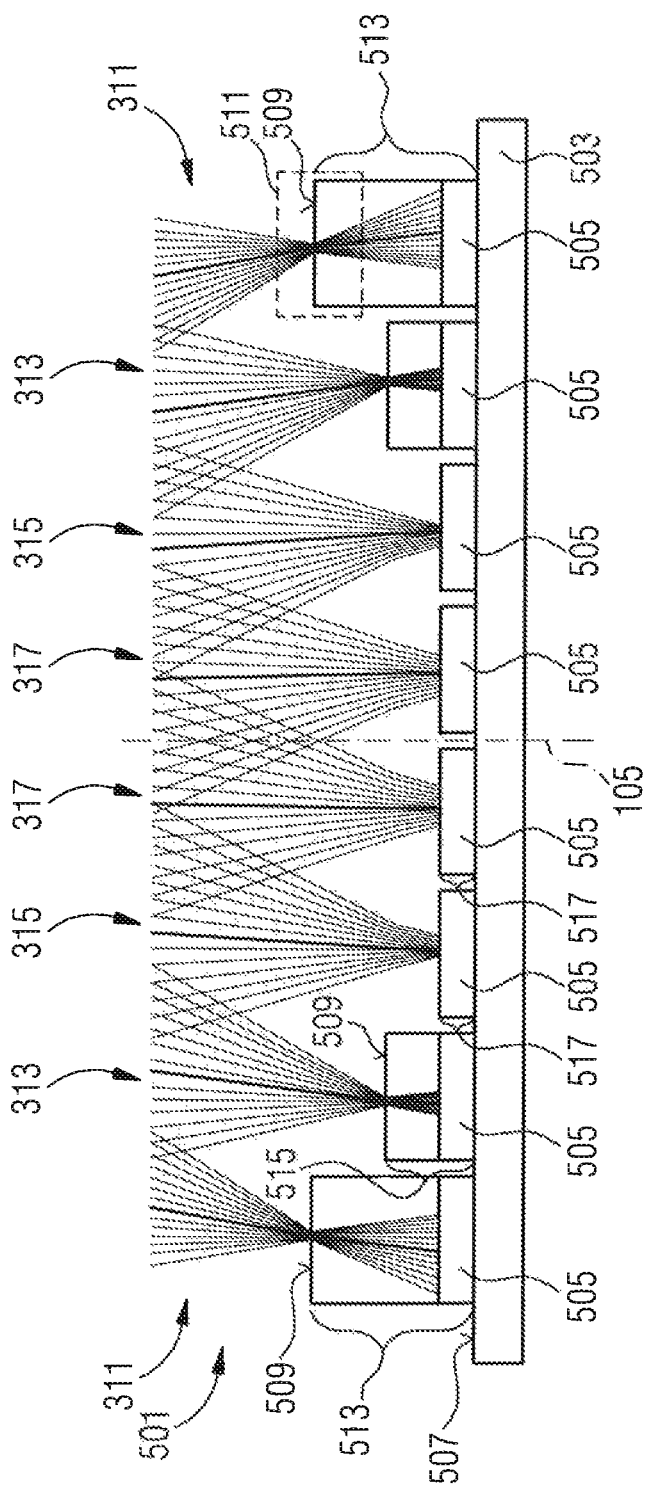

SENSOR DEVICE

This patent application is a national phase filing under section 371 of PCT/EP2016/055870, filed Mar. 17, 2016, which claims the priority of German patent application 10 2015 104 208.8, filed Mar. 20, 2015, each of which is incorporated herein by reference in its entirety.

TECHNICAL FIELD

The invention relates to a sensor device. The invention further relates to a lidar system and a vehicle.

BACKGROUND

A simple converging lens can image a beam of light rays onto a photodiode array. Beams which are incident on the converging lens at a large angle in relation to the optical axis of the converging lens impinge on the photodiode array in the image plane at a greater distance from the optical axis. The greater the distance from the optical axis in the image plane, the greater the imaging aberration (field curvature) becomes. The beam is now no longer focused at one point in the image plane but instead imaged as an elliptical spot.

Hence, as a rule, it is not possible in the case of relatively large photodiode arrays to obtain focused imaging even on photodiodes that are far away from the optical axis. This leads to a deterioration of the resolution in the edge regions since a certain angular segment is then imaged on two photodiodes.

In general, imaging aberrations can be compensated by complicated optics, for example, multi-lens-element objective lenses.

SUMMARY OF THE INVENTION

Embodiments of the invention provide an efficient concept which can reduce an optical imaging aberration of a lens arrangement.

According to one aspect, a sensor device comprises a carrier, which has a plane carrier surface, on which a multiplicity of photodetectors are arranged, said photodetectors each comprising a photosensitive sensor area, which is distant from the carrier surface, and a lens arrangement arranged opposite the sensor areas and comprising an optical axis, for optical imaging of electromagnetic radiation onto the sensor areas such that the lens arrangement can image electromagnetic radiation onto the sensor areas, wherein the multiplicity of photodetectors comprise at least one photodetector, the sensor area of which comprises at least one property which differs from a property of a sensor area of a photodetector of the multiplicity of photodetectors which, in relation to the optical axis of the lens arrangement, is arranged closer to the optical axis on the carrier surface than the at least one photodetector in order to reduce an optical imaging aberration of the lens arrangement.

According to a further aspect, provision is made of a lidar system which comprises a laser for emitting electromagnetic radiation and the sensor device.

In accordance with another aspect, provision is made of a vehicle which comprises the lidar system.

The invention is based on the discovery that imaging aberrations, e.g., a field curvature of a lens arrangement, depend, in particular, on a distance from the optical axis of the lens arrangement. Thus, this means that, as a rule, an imaging aberration becomes larger with increasing distance from the optical axis of the lens arrangement. Now, according to the invention, provision is made for at least one of the photodetectors to have a sensor area with a property which differs from a property of a sensor area of a further photodetector which, in relation to the optical axis of the lens arrangement, is arranged closer to the optical axis on the carrier surface than the photodetector with the different sensor area. Thus, the sensor area of a photodetector further away comprises a different property in relation to a sensor area of a photodetector arranged closer to the optical axis. As a result of this different property, it is advantageously possible to take account of the fact that an imaging aberration increases with increasing distance from the optical axis. As a result of this, it is thus advantageously possible to reduce an optical imaging aberration of the lens arrangement. This can be carried out, in particular, by a suitable adaptation of the property of the sensor area.

Thus, according to the invention, provision is made for the sensor areas of photodetectors to differ from sensor areas of further photodetectors which are arranged further away from the optical axis.

In particular, the phrase "at least one" comprises the phrase "one or more".

According to one embodiment, the carrier is formed as a printed circuit board, which can also be referred to as a circuit board. As a rule, the German term "Leiterplatte" is referred to as a printed circuit board in English. By way of the provision of a printed circuit board as a carrier, it is possible to advantageously bring about efficient electrical contacting of the photodetectors.

In particular, the optical axis of the lens arrangement denotes the straight line that coincides with the axis of symmetry of the lens arrangement. Should the lens arrangement comprise a plurality of lenses, the optical axis of the lens arrangement denotes the line that is formed by the optical axis of the individual lenses.

According to one embodiment, the lens arrangement comprises an individual lens.

According to a further embodiment, the lens arrangement comprises a plurality of lenses.

By way of example, a lens within the meaning of the present invention is a converging lens.

According to one embodiment, the photodetectors are elements selected from the following group of photodetectors: photocells, photomultipliers, CMOS sensors, CCD sensors, photodiodes, pin photodiodes, avalanche photodiodes, PSD (position sensitive device) photodiodes, phototransistors, photo resistors. In particular, this therefore means that the photodetectors are, e.g., photodiodes.

A photodetector within the meaning of the present invention is therefore, in particular, an electronic component which converts light into an electrical signal using the photoelectric effect and/or exhibits an electrical resistance that is dependent on the captured electromagnetic radiation.

The term "light" within the meaning of the present invention comprises, in particular, "infrared light" and "ultraviolet light". That is to say that, in particular, the electromagnetic radiation lies in a wavelength range between, e.g., 300 nanometers to 1200 nanometers. In particular, subranges of the aforementioned wavelength range are provided. By way of example, the photodetectors are configured to capture ultraviolet light or infrared light. Particularly when using the sensor apparatus in a lidar system, provision is made, for example, for the photodetectors to be able to measure or capture electromagnetic radiation in a wavelength range between 850 nm and 1000 nm and/or between 1520 nm and 1570 nm.

According to one embodiment, provision is made for the at least one property to comprise a height of the sensor area relative to the carrier surface such that the at least one photodetector comprises a more elevated sensor area than the photodetector which is arranged closer to the optical axis on the carrier surface.

In particular, this brings about the technical advantage that the imaging aberration relating to a field curvature can be reduced or even compensated or corrected. This is because, as explained in the introductory part of the description, the field curvature increases with increasing distance from the optical axis in the image plane. However, as a result of provision being made according to the invention for the height of the sensor area to increase with greater distance from the optical axis, this imaging aberration is efficiently reduced or even corrected. The point at which the beam is focused by means of the lens arrangement now lies, ideally, in the curved image plane or at least closer to the image plane than for the case where the height of the sensor area of the at least one photodetector is the same as the height of the sensor area of the photodetector which is arranged closer to the optical axis on the carrier surface. In the latter case, the beam would be imaged as an elliptical spot. However, this is reduced or even avoided on account of the elevated or greater height of the sensor area of the at least one photodetector.

In accordance with a further embodiment, provision is made for a length of the at least one photodetector perpendicular to the carrier surface to be greater than a length of the photodetector perpendicular to the carrier surface which is arranged closer to the optical axis on the carrier surface.

This brings about, in particular, the technical advantage that a greater height of the sensor area of the at least one photodetector can be brought about efficiently. In particular, this therefore advantageously facilitates the photodetector to be configured to be correspondingly longer, already during the production of the photodetector.

Here, in particular, the length denotes an extent of the photodetector perpendicular to the carrier surface. In particular, the length can be denoted to be a height or a thickness of the photodetector.

In accordance with a further embodiment, provision is made for the photodetectors to be formed as semiconductor components comprising different semiconductor layers such that the greater length of the at least one photodetector is at least partly formed by means of a different layer thickness of at least one of the semiconductor layers in relation to the layer thicknesses of the photodetector which is arranged closer to the optical axis on the carrier surface.

In particular, this brings about the technical advantage that the at least one photodetector can be configured to be longer or higher by modified process parameters in an efficient manner during the production of the semiconductor components.

A semiconductor component within the meaning of the present invention comprises, in particular, a semiconductor layer as substrate layer. By way of example, provision is made according to one embodiment for the substrate layer of the at least one photodetector with the sensor area comprising the different property to have a thicker configuration in comparison with the substrate layer of the photodetector which is arranged closer to the optical axis on the carrier surface. Hence, provision is made, in particular, for the photodetectors only to differ in terms of their substrate layer thickness. The further semiconductor layers in particular have the same form, i.e., have, in particular, a same layer thickness.

According to one embodiment, the greater length of the at least one photodetector is formed exclusively by means of a different layer thickness of at least one of the semiconductor layers. That is to say that, in accordance with this embodiment, the greater height of the sensor area of the at least one photodetector is only brought about by way of the different substrate layer thickness.

In accordance with a further embodiment, provision is made for the at least one photodetector to be arranged on a spacer arranged on the carrier surface.

In particular, this brings about the technical advantage of allowing a greater height of the sensor area of the at least one photodetector to be brought about in an efficient manner. In particular, this therefore advantageously facilitates the use of identical photodetectors since the greater height according to one embodiment is only brought about by means of the spacer. Further, a flexible adaptation to a specific sensor area height is facilitated in an advantageous manner by means of a suitable selection of a spacer.

The at least one photodetector being arranged on a spacer arranged on the carrier surface thus means, in particular, that the at least one photodetector is arranged indirectly, i.e., by means of the spacer, on the carrier surface. This distinguishes it from an embodiment without a spacer, in which the at least one photodetector is arranged directly on the carrier surface.

According to one embodiment, the spacer is a submount. In particular, the submount comprises a carrier function; i.e., it may be referred to as a carrier. In order to distinguish it better from the carrier referred to above, the submount may therefore be referred to as a subcarrier.

According to one embodiment, the spacer is formed as a circuit board or as a printed circuit board.

According to one embodiment, the spacer is a ceramic substrate.

As an alternative to a ceramic substrate, provision can be made according to one embodiment for the spacer to be formed from a plastic metallized by electroplating (so-called MID technology, the abbreviation MID standing for "molded interconnect devices", i.e., injection-molded circuit carriers). That is to say, the spacer is formed, e.g., as an MID component.

In accordance with a further embodiment, provision is made for the spacer to comprise one or more vias for electrical contacting of the at least one photodetector.

In particular, this brings about the technical advantage of facilitating efficient electrical contacting of the at least one photodetector. A through connection within the meaning of the present invention can be referred to, in particular, as a via.

That is to say, in particular, that one or more vias extend through the spacer such that the at least one photodetector can be electrically contacted by way of these vias.

According to a further embodiment, provision is made for the spacer, on the surface thereof, to comprise a metallization layer for electrical contacting of the at least one photodetector.

In particular, this brings about the technical advantage that efficient electrical contacting of the at least one photodetector is facilitated. As a rule, the application of a metallization layer onto the spacer is a process that can easily be implemented by technical means, and so the corresponding sensor device can be produced easily.

According to another embodiment, provision is made for the metallization layer to be formed extending from a surface of the spacer that is distant from the carrier surface, the at least one photodetector being arranged on said surface of the spacer, to a surface of the spacer facing the carrier surface.

In particular, this brings about the technical advantage that efficient electrical contacting of the at least one photodetector can be produced. The metallization layer thus extends at least from the surface of the spacer which is distant from the carrier surface to the surface of the spacer that faces the carrier surface.

According to one embodiment, the at least one photodetector is arranged on the surface of the spacer which is distant from the carrier surface. According to an embodiment, the spacer is arranged on the carrier surface with the surface that faces the carrier surface.

In accordance with a further embodiment, provision is made for the at least one property to comprise a size of the sensor area such that the at least one photodetector has a larger sensor area than the photodetector which is arranged closer to the optical axis on the carrier surface.

In particular, this brings about the technical advantage that it is possible to prevent a specific angle segment from being imaged on two photodetectors in the case of distant imaging in relation to the optical axis. This is because an elliptical spot produced on account of the imaging aberration (field curvature) is only imaged on the larger sensor area on account of said larger sensor area and not imaged simultaneously on two smaller sensor areas of two photodetectors. This can also efficiently reduce or even compensate or correct an optical imaging aberration.

According to one embodiment, the laser is a pulsed laser. That is to say that the pulsed laser emits laser pulses. This advantageously facilitates an efficient optical distance measurement.

The lidar system can advantageously be used for an optical distance measurement. Here, the laser emits electromagnetic radiation, e.g., laser pulses, which is reflected by an object situated in the surroundings of the lidar system. The reflected electromagnetic radiation is captured or measured in part by means of the sensor device, more precisely by means of the photodetectors, and so a time-of-flight measurement is facilitated.

The arrangement comprising the carrier and the multiplicity of photodetectors may, for example, be referred to as a photodetector array. Should the photodetectors be photodiodes, the arrangement may, in particular, be referred to as a photodiode array.

That is to say that the sensor device comprises a photodetector array, in particular a photodiode array.

BRIEF DESCRIPTION OF THE DRAWINGS

The above-described properties, features and advantages of this invention and the manner in which they are achieved will become clearer and more easily understandable in conjunction with the following description of the exemplary embodiments, which are explained in more detail in conjunction with the drawings, wherein
FIG. 3 shows a photodiode array,
FIG. 4 shows a sectional magnification of a section of the photodiode array in accordance with FIG. 3,
FIG. 5 shows a sensor device,
FIG. 6 shows a sectional magnification of a section of the sensor device in accordance with FIG. 5.

Below, the same reference signs can be used for the same features.

DETAILED DESCRIPTION OF ILLUSTRATIVE EMBODIMENTS

Figure 1:
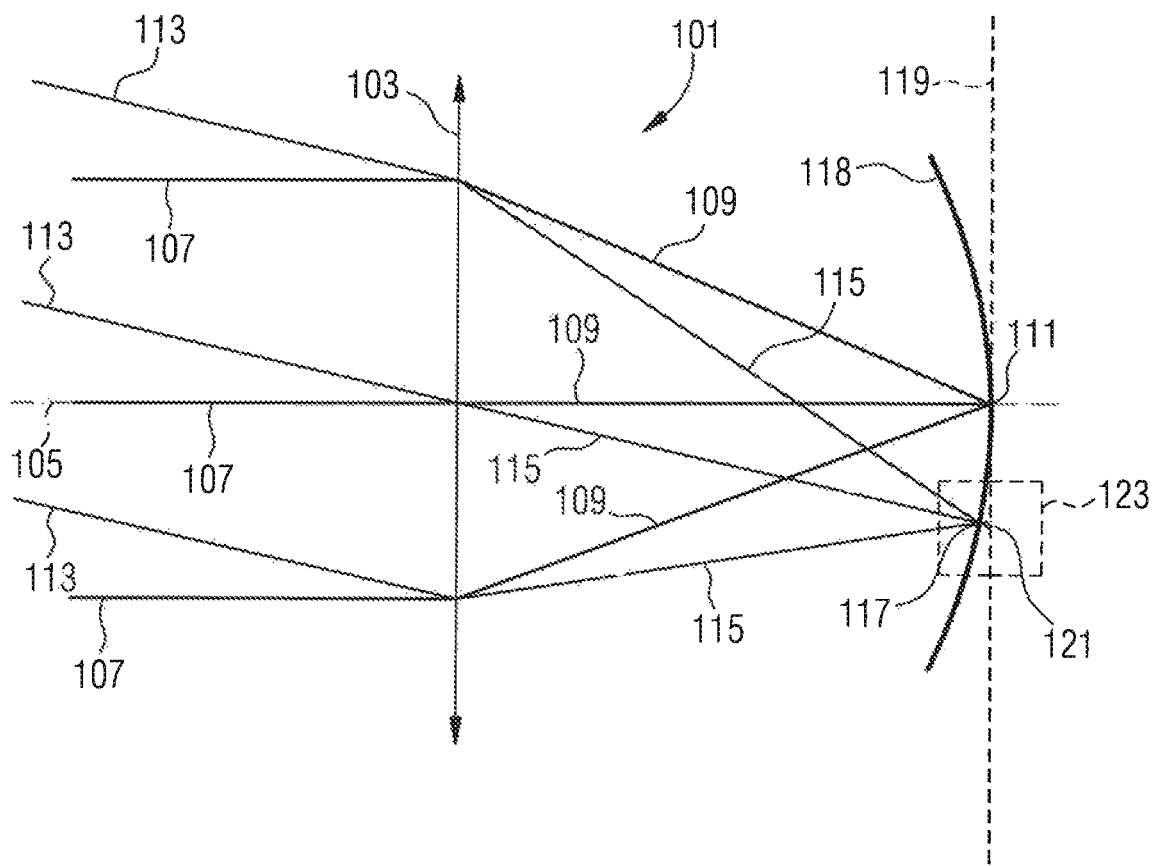
FIG. 1 shows a lens arrangement.

FIG. 1 shows a lens arrangement 101.

The lens arrangement 101 comprises a converging lens 103 which is represented symbolically here by means of a double-headed arrow. An optical axis of the converging lens 103, and hence of the lens arrangement 101, is denoted by means of reference sign 105.

Reference sign 107 points to rays which extend parallel to the optical axis 105. These rays 107 therefore form a beam that extends parallel to the optical axis 105. The converging lens 103 refracts the individual rays 107 and focuses them on a point 111. The rays that are refracted by means of the converging lens 103 are referred to here as focused rays and are denoted by reference sign 109. That is to say that the beam that extends parallel to the axis, i.e., the rays 107 are focused on a point, the point 111 in this case.

Furthermore, rays 113 which do not extend parallel to the optical axis 105 are plotted. These rays 113 are likewise refracted by means of the converging lens 103. In a manner analogous to the rays 107 that extend parallel to the axis, the refracted rays are also referred to as focused rays in this case and are provided with reference sign 115. That is to say, the non-parallel rays 113 are focused in a point 117 by means of the converging lens 103.

On account of the imaging aberrations (field curvature) of the converging lens 103, the points 111, 117, i.e., in general, the points on which the individual beams are focused by means of the converging lens 103, do not lie in a common plane but instead lie in a curved area which is symbolically provided with reference sign 118 in this case. The curved area 118 is the curved image plane.

On a straight plane 119, which extends perpendicular to the optical axis 109 and through the point in, the individual beams are presented as a widened spot 121 on account of the field curvature.

The beam impinging on the converging lens 103 at a large angle, e.g., the rays 113, is focused on the curved area 118, the curved image plane, at one point, for example, at the point 117. However, on the straight plane 119, this beam, i.e., for example, the rays 113, is depicted as a widened spot 121.

Figure 2:
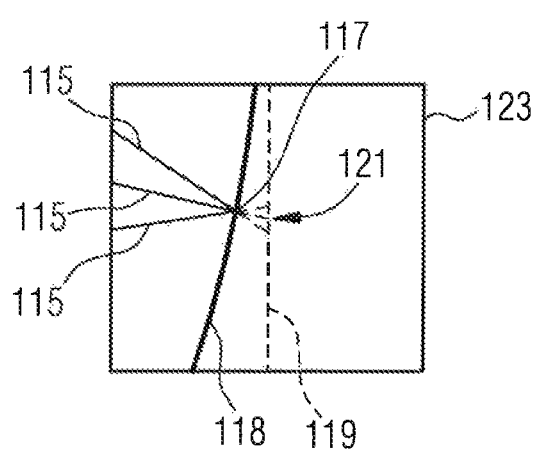
FIG. 2 shows a sectional magnification of a section of the lens arrangement from FIG. 1.

Reference sign 123 points to a section in FIG. 1 which is presented in FIG. 2 in a magnified fashion.

Thus, the imaging aberration described above leads to a field curvature. If this imaging aberration is not corrected or compensated, or at least reduced, a situation as is described in more detail below in conjunction with FIG. 3 may arise.

FIG. 3 shows a photodiode array 301.

The photodiode array 301 comprises a printed circuit board 303 comprising a plane printed circuit board surface 305. A plurality of photodiodes 307 is arranged on the printed circuit board surface 305. The photodiodes 307 each have a sensor area 310, which is distant from the printed circuit board surface 305. Reference signs 311, 313, 315, 317 point to respective beams, as are produced by a lens arrangement, for example, the converging lens 103 from FIG. 1. That is to say that the converging lens 103 focuses the corresponding rays of the beams 311, 313, 315, 317, with the points on which the individual rays of the beams 311, 313, 315, 317 are focused lying at a greater or lesser distance from the sensor area 310, depending on a distance from the optical axis 105, on account of the imaging aberration described above. That is to say that beams which extend with a greater distance from the optical axis 105 are focused less well on the sensor area 310 in comparison with beams which lie closer to the optical axis 105.

For reasons of clarity, only the optical axis 105 but not the lens arrangement 101 has been plotted here.

Reference sign 311 denotes the beams for the outermost photodiodes 307 in relation to the optical axis 105. Reference sign 313 denotes the beams for the photodiodes 307 which lie third furthest out in relation to the optical axis 105. Reference sign 315 denotes the beams for the photodiodes 307 which lie second furthest out in relation to the optical axis 105. Reference sign 317 denotes the beams for the photodiodes 307 which lie closest to the optical axis 105 in relation to the optical axis 105.

Better imaging of the individual light rays is facilitated for the photodiodes 307 which are arranged closer to the optical axis 105 on the printed circuit board surface 305. Worse imaging of the rays of the individual beams is realized for the photodiodes 307 which, in relation to these photodetectors, lie further away from the optical axis 105 on the printed circuit board surface 305. That is to say that the greater the distance of a photodiode 307 from the optical axis 105, the greater the imaging aberration, in particular the field curvature in this case.

Reference sign 319 points to a section of the photodiode array 301 which is presented in a magnified fashion in FIG. 4. As the sectional magnification in accordance with FIG. 4 shows, the rays of the beam 311 are no longer imaged as a point on the sensor area 310, but instead imaged as an enlarged or widened spot.

FIG. 5 shows a sensor device 501.

The sensor device 501 comprises a carrier 503 which, for example, can be formed as a printed circuit board. Such a printed circuit board may also be referred to as a base printed circuit board. Hence, the carrier 503 may, in general, also be referred to as a base carrier.

The sensor device 501 comprises a plurality of photodetectors 505 which are arranged on a plane carrier surface 507 of the carrier 503. The photodetectors 505 each have a photosensitive sensor area 509. The photodetectors 505 are arranged on the carrier surface 507 in such a way that the photosensitive sensor area 509 of the respective photodetectors 505 is distant from the carrier surface 507.

By way of example, the photodetectors 505 are photodiodes.

For reasons of clarity, only the optical axis 105 of a lens arrangement but not the lens arrangement itself has been plotted here. The latter lies opposite the sensor areas 509 such that the lens arrangement (not depicted here) is able to image electromagnetic radiation onto the sensor areas. Thus, the photodetectors 505 lie between the carrier 503 and the lens arrangement.

Reference sign 511 points to a section of the sensor device 501 which is presented in a magnified manner in FIG. 6.

Reference sign 513 points to a brace which characterizes a height of the sensor area 509 of the outermost photodetector 505 in relation to the carrier surface 507. Analogously, reference sign 515 points to a brace which characterizes a height of the sensor area 509 of the third furthest out photodetector 505 in relation to the optical axis 105. Analogously, reference sign 517 points to a brace which characterizes the height of the second furthest out photodetector 505 in relation to the optical axis 105.

As shown in FIG. 5, the heights 513, 515, 517 differ. Here, the height 513 is greater than the height 515, which is greater than the height 517. That is to say that the height of the sensor area 509 of the corresponding photodetector 505 increases as the distance of a photodetector 505 increases from the optical axis 105 in relation to the optical axis 105. Preferably, the corresponding heights of the sensor areas 509 are matched to the field curvature produced on account of the imaging aberration. But even if the ideal profile of the field curvature is not achieved, the sensor areas 509 of the individual photodetectors 505 lie closer to the actual point on which the lens arrangement focuses the individual rays of the beams 311, 313, 315, 317 on account of the different heights. Thus, a size of a possibly widened spot is minimized, and so, ultimately, this brings about a reduction in the imaging aberration.

The sectional magnification from FIG. 6 shows this clearly when said sectional magnification is compared to the sectional magnification from FIG. 4.

Hence, what this facilitates in an advantageous manner is that, even at a large distance from the optical axis 105, imaging of the rays can be effectuated in a point or at least in a widened spot with a reduced size in relation to the non-corrected case.

By way of example, an individual photodetector 505 can form generally a pixel in a photodetector array. Hence, provision according to one embodiment is made, in general, for the individual pixels in such a photodetector array to have different heights, with the heights being dependent on a distance from the optical axis 105.

There are a number of options to effectuate these different heights. Exemplary embodiments for bringing about these different heights are described below.

Figure 7:
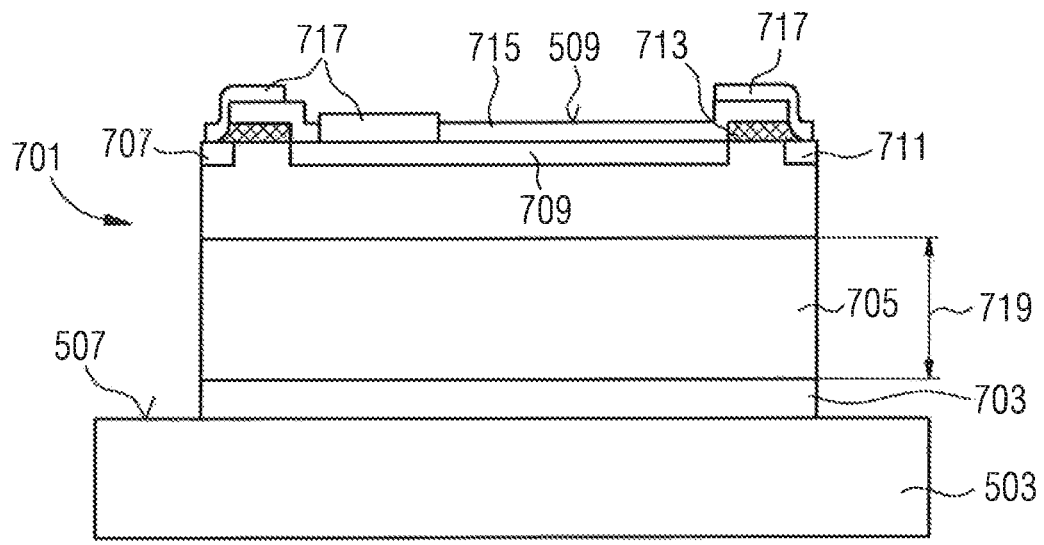
FIG. 7 shows a photodetector.

FIG. 7 shows a photodetector 701 which is formed as a semiconductor component.

Reference signs 703, 705, 707, 709, 711, 713, 715 each point to semiconductor layers which form the photodetector 701. Reference sign 703 points to a rear-side contact of the photodetector 701, which is not presented in any more detail.

In detail, reference sign 705 points to a substrate layer which, for example, can be $n^+$ doped. Reference sign 707 points to an $n^+$ doped semiconductor layer. Reference sign 709 points to a $p^+$ doped semiconductor layer. Reference sign 711 points to an $n^+$ doped semiconductor layer. Reference sign 713 points to a $SiO_2$ semiconductor layer. Reference sign 715 points to an $Si_3N_4$ semiconductor layer.

Reference sign 717 points to electrical contacts, e.g., aluminium contacts, for the purposes of an electrical contacting of the photodetector 701, which is embodied as a photodiode in this case. How a photodiode is constructed as a semiconductor component with individual semiconductor layers with appropriate doping is known per se to a person skilled in the art and therefore not explained in any more detail in this context.

According to one embodiment, provision is made for a layer thickness 719, which is here presented symbolically by means of a double-headed arrow, of the substrate layer 705 of the photodiode 701 to be varied. That is to say that different lengths of the photodiode 701 can be obtained by means of a variation of the layer thickness 719 of the substrate layer 705, with the length denoting the extent of the photodiode 701 in relation to a direction perpendicular to the carrier surface 507. Hence, a height of the sensor area 509 can advantageously be varied by means of different substrate layer thicknesses.

On account of the above-described variation in the thickness of the substrate layer, it is therefore rendered possible, in an advantageous manner, to produce a plurality of photodiodes 701 with different substrate thicknesses 719 of the substrate layer 705. Such photodiodes 701 can then be used as photodetectors 505 of the sensor device 501.

Varying the layer thicknesses 719 of the substrate layers 705 can advantageously already be effectuated or carried out in an efficient manner during a semiconductor production process of the photodiodes 701. That is to say that the photodiodes 701 are already provided with these different layer thicknesses during the production thereof.

Figure 8:
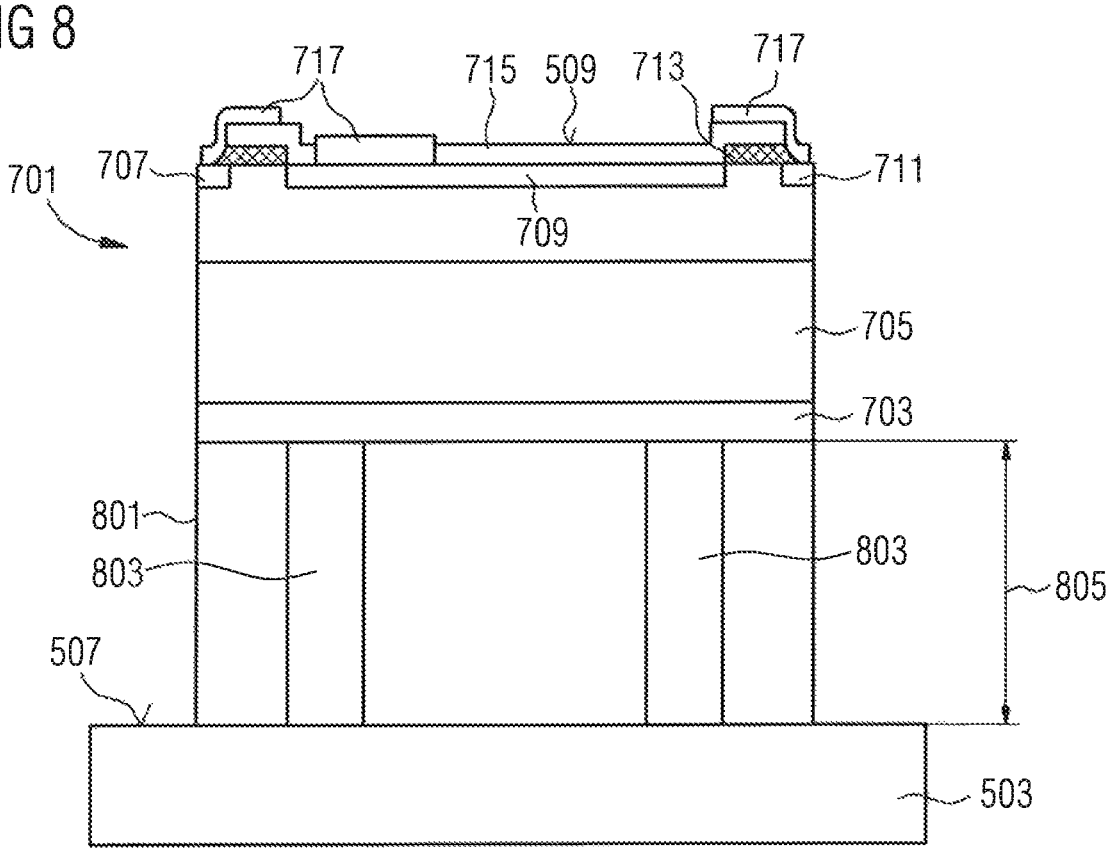
FIG. 8 shows the photodetector from FIG. 7 on a spacer.

FIG. 8 shows a further option for obtaining a different height of the sensor area 509.

In accordance with this embodiment, the photodetector 701, which, e.g., may be formed as a photodiode, is arranged on a spacer 801, with this spacer 801 being arranged on the carrier surface 507. That is to say that the photodetector 701 is arranged indirectly, i.e., by means of the spacer 801, on the carrier surface 507.

According to one embodiment, the spacer 801 is formed as a submount. In particular, the spacer 801 is formed as a circuit board or as a printed circuit board.

The spacer 801 comprises two vias 803, by means of which the photodetector 701 can be electrically contacted.

A height of the spacer 801 is represented symbolically using a double-headed arrow with reference sign 805. The height of the spacer 801 in this case refers to the extent of the spacer 801 in the perpendicular direction in relation to the plane carrier surface 507.

Thus, by using differently high spacers 801, it is possible to obtain different heights of the sensor area 509 in relation to the carrier surface 507.

That is to say that, in accordance with the exemplary embodiment from FIG. 8, a variation in the height of the sensor surfaces 509 can be obtained, for example, by using individual circuit boards as so-called submounts, generally by using spacers with different heights, for the individual photodetectors 701. The spacers 801, in particular the circuit boards, comprise vias 803 for advantageously establishing an electrical contact between a rear side of the photodiode 701, in this case the side of the layer 703 that faces the spacer 801, and the carrier surface 507. Thus, for example, such spacers can be used for the photodetectors 505 of the sensor device 501. In particular, the sensor device 501 can comprise photodetectors 701 which, analogously to FIG. 8, are each arranged on a spacer 801.

Figure 9:
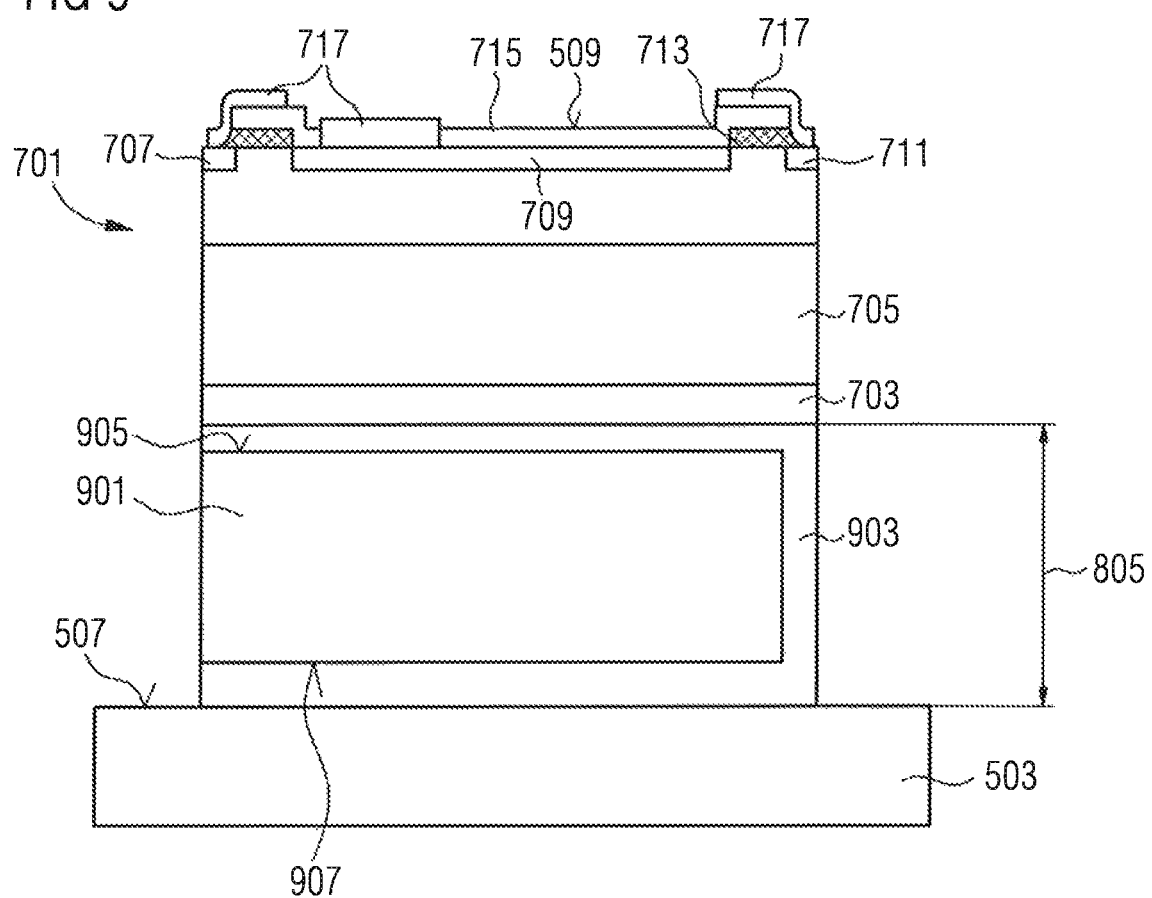
FIG. 9 shows the photodetector from FIG. 7 on a further spacer.

FIG. 9 shows an exemplary embodiment which is formed substantially analogously to the exemplary embodiment from FIG. 8. The difference here is that a different spacer 901, which comprises a metallization layer 903, is provided in place of the spacer 801. This metallization layer 903 extends from a surface 905 of the spacer 901 that faces the photodetector 701 to a surface 907 of the spacer 901 that faces the carrier surface 507. Thus, in general, the metallization layer 903 extends from an upper side (surface 905) to a lower side (surface 907) of the spacer 901.

Analogously to FIG. 8, a height of the spacer 901 is also denoted here by reference sign 805.

By way of example, the spacer 901 is a ceramic substrate which, for example, is provided with the metallization layer 903. As an alternative to a ceramic substrate, provision can be made for the spacer 901, according to one embodiment, to be formed from a plastic that is metallized by electroplating (so-called MID technology, with the abbreviation MID standing for "molded interconnect devices", i.e., injection-molded circuit carriers). That is to say that the spacer 901 is formed, for example, as an MID component. The metallization layer 903, in particular, renders it possible to establish an electrical contact between a rear side of the photodetector 701 and the carrier surface 507.

Analogously to FIG. 8, it is therefore possible to vary the height of the individual sensor areas 509 by using differently high spacers 901. Hence, it is possible, for example, to use the photodiodes 701 comprising the different heights of the sensor areas 509 that are produced by means of the spacers 801, 901, in accordance with FIGS. 8 and/or 9, as photodetectors 505 of the sensor device 501 in accordance with FIG. 5.

Figure 10:
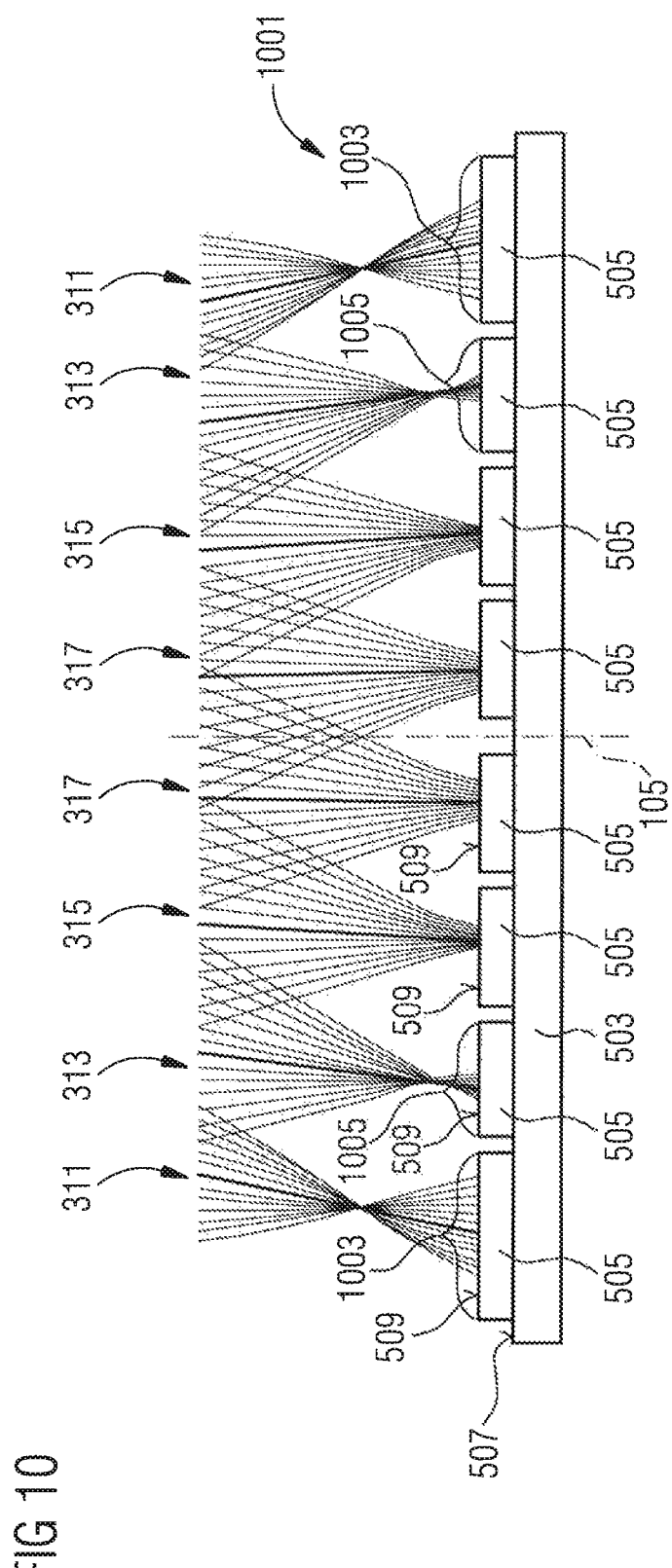
FIG. 10 shows a sensor device.

FIG. 10 shows a sensor device 1001.

The sensor device 1001 has a substantially analogous structure to the sensor device 501 in FIG. 5. A difference is that the sensor areas 509 of the photodetectors 505 of the sensor device 1001 all have a same height. In order nevertheless to be able to reduce or correct or compensate the imaging aberration (field curvature), provision is made according to this embodiment for a size of the sensor area 509 to be varied depending on a distance of the corresponding photodetector 505 from the optical axis 105.

Reference sign 1003 symbolically points to a brace which characterizes the size of the sensor area 509 of the outermost photodetector 505 in relation to the optical axis 105. Analogously, reference sign 1005 points to a brace which symbolically characterizes the size of the sensor area 509 of the photodetector 505 which is arranged as third furthest out in relation to the optical axis 105 on the carrier surface 507.

As FIG. 10 vividly shows, the size 1003 of the sensor area 509 of the outermost photodetector 505 is greater than the size of the sensor area 509 of the photodetector 505 which, in relation to the outermost photodetector 505, is arranged closer to the optical axis 105 on the carrier surface 507.

In particular, this means that larger photodetectors 505, i.e., larger sensor areas, are also used with an increasing distance from the optical axis 105. Advantageously, this can ensure that a defined angle segment in relation to the optical axis 105 is only imaged on one sensor area 509 of a photodetector 505.

Figure 11:
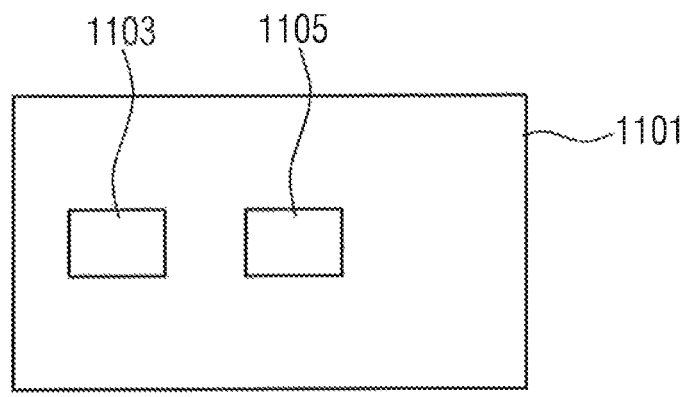
FIG. 11 shows a lidar system.

FIG. 11 shows a lidar system 1101.

The lidar system 1101 comprises a laser 1103, in particular a pulsed laser, for emitting electromagnetic radiation, in particular laser pulses. The lidar system 1101 comprises a sensor device 1105, as already described, e.g., above in conjunction with FIGS. 5 to 10 and in the general part of the description.

By way of example, such a lidar system 1101 can be used for an optical distance measurement to an object in the surroundings of the lidar system 1101. Here, the laser 1103 emits electromagnetic radiation, in particular laser pulses. An object situated in the surroundings of the lidar system 1101 reflects this electromagnetic radiation back in the direction of the sensor device 1105, at least in part, said sensor device being able to capture this back-reflected electromagnetic radiation by means of the photodetectors. Hence, it is therefore possible to advantageously effectuate a time-of-flight measurement, by means of which, in turn, it is possible to determine a distance to the object.

Figure 12:
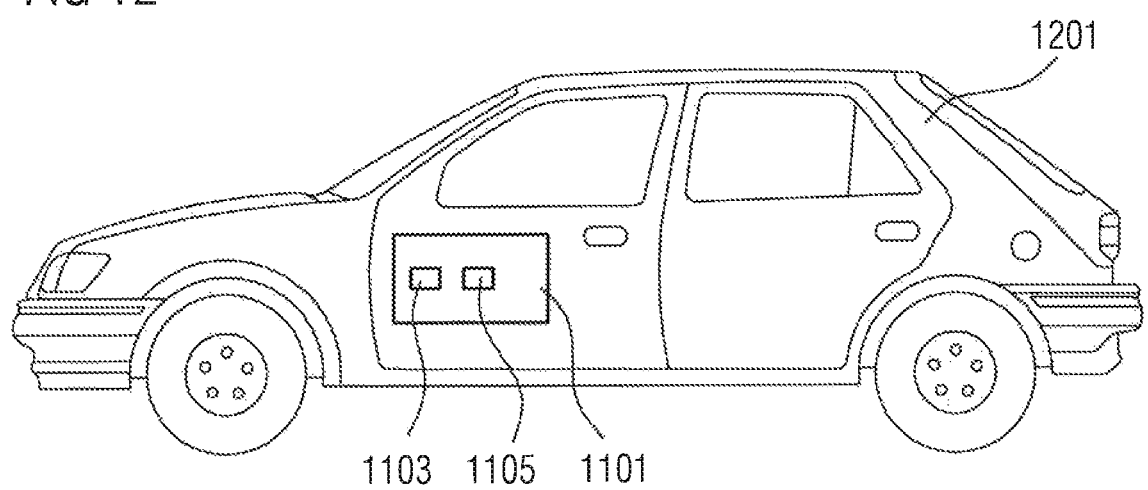
FIG. 12 shows a vehicle.

FIG. 12 shows a vehicle 1201.

The vehicle 1201 comprises the lidar system 1101 from FIG. 11.

In summary, the present invention provides an efficient concept which renders it possible to reduce or compensate the imaging aberration of a lens arrangement in a simple manner, i.e., without complicated and expensive optics. Here, according to one embodiment, provision is made for the individual photodetectors, in particular the individual photodiodes, to be embodied with a greater height depending on their distance from the optical axis of the lens arrangement in order to adapt an image plane to the curved image field of the lens arrangement which, in general, can be referred to as an optical system. In particular, this means that a height of the photodetector increases with increasing distance of a photodetector from the optical axis.

By way of example, according to one embodiment, the greater height of the sensor areas of the photodetectors can be obtained by modified process parameters during the production of the individual photodetectors. By way of example, a different substrate thickness may be provided. Moreover, according to one embodiment, the height of the photodetectors can be changed by using spacers, e.g., submounts, which are installed or arranged between the photodetector and the carrier.

According to one embodiment, provision can also be made for the photodetectors to be embodied with different base areas, i.e., to comprise differently large sensor areas. In particular, that is to say that larger photodetectors, i.e., photodetectors comprising a larger sensor area, are also used with a greater distance from the optical axis. In this manner, it is advantageously possible to ensure that a defined angle segment is only imaged on a sensor area of an individual photodetector.

Even though the invention has been more specifically illustrated and described in detail by the preferred exemplary embodiment, the invention is not restricted by the disclosed examples and other variations can also be derived therefrom by a person skilled in the art, without departing from the scope of protection of the invention.

The invention claimed is:

1. A sensor device comprising:
a carrier comprising a plane carrier surface;
a plurality of photodetectors arranged on the carrier surface, each photodetector comprising a photosensitive sensor area, which is distant from the carrier surface; and
a lens arrangement arranged opposite the sensor areas,
wherein the lens arrangement comprises an optical axis,
wherein the lens arrangement is configured to image electromagnetic radiation onto the sensor areas,
wherein the plurality of photodetectors comprises at least one first photodetector having a first sensor area, the first sensor area comprises at least one property which differs from a property of a second sensor area of a second photodetector of the plurality of photodetectors,
wherein the second photodetector is arranged closer to the optical axis than the at least one first photodetector in order to reduce an optical imaging aberration of the lens arrangement, and
wherein the at least one property comprises a height of the first sensor area relative to the carrier surface such that the first sensor area of the at least one first photodetector is more elevated on the carrier surface than the second sensor area of the second photodetector.

2. The sensor device according to claim 1, wherein the at least one property comprises a length of the at least one first photodetector which is perpendicular to the carrier surface and which is greater than a length of the second photodetector which is perpendicular to the carrier surface.

3. The sensor device according to claim 2, wherein the plurality of photodetectors comprises semiconductor components comprising different semiconductor layers such that the greater length of the at least one first photodetector is at least partly formed by a different layer thickness of at least one of the semiconductor layers in relation to a layer thicknesses of the second photodetector.

4. The sensor device according to claim 1, wherein the at least one first photodetector is arranged on a spacer, and wherein the spacer is arranged on the carrier surface.

5. The sensor device according to claim 4, wherein the spacer comprises one or more vias for electrical contacting the at least one first photodetector.

6. The sensor device according to claim 4, wherein the spacer, on a surface thereof, comprises a metallization layer for electrical contacting the at least one first photodetector.

7. The sensor device according to claim 1, wherein the at least one first photodetector is arranged on a first surface of a spacer, wherein the spacer is arranged with its second surface on the carrier surface, wherein the first surface comprises a metallization layer for electrical contacting the at least one first photodetector, and wherein the metallization layer extends from the first surface to the second surface.

8. The sensor device according to claim 1, wherein the at least one property is a size of the sensor area such that the at least one first photodetector comprises a larger sensor area than the second photodetector.

9. A lidar system comprising:
a laser configured to emit electromagnetic radiation; and
the sensor device according to claim 1.

10. A vehicle comprising the lidar system according to claim 9.

11. The sensor device according to claim 1, wherein the plurality of photodetectors directly adjoins the carrier surface.

12. A sensor device comprising:
a carrier comprising a plane carrier surface;
a plurality of photodetectors arranged on the carrier surface, each photodetector comprising a photosensitive sensor area, which is distant from the carrier surface; and
a lens arrangement arranged opposite the sensor areas,
wherein the lens arrangement comprises an optical axis,
wherein the lens arrangement is configured to image electromagnetic radiation onto the sensor areas,
wherein the plurality of photodetectors comprises at least one first photodetector having a first sensor area, the first sensor area comprises at least one property which differs from a property of a second sensor area of a second photodetector of the plurality of photodetectors,
wherein the second photodetector is arranged closer to the optical axis than the at least one first photodetector in order to reduce an optical imaging aberration of the lens arrangement,
wherein the at least one property comprises a height of the first sensor area relative to the carrier surface such that the first sensor area of the at least one first photodetector is more elevated on the carrier surface than the second sensor area of the second photodetector,
wherein the at least one first photodetector is arranged on a spacer,
wherein the spacer is arranged on the carrier surface, and
wherein the spacer, on a surface thereof, comprises a metallization layer for electrical contacting the at least one first photodetector.

13. A lidar system comprising:
a laser configured to emit electromagnetic radiation; and
the sensor device according to claim 12.

14. A vehicle comprising the lidar system according to claim 13.

15. A sensor device comprising:
a carrier comprising a plane carrier surface;
a plurality of photodetectors arranged on the carrier surface, each photodetector comprising a photosensitive sensor area, which is distant from the carrier surface; and
a lens arrangement arranged opposite the sensor areas,
wherein the lens arrangement comprises an optical axis,
wherein the lens arrangement is configured to image electromagnetic radiation onto the sensor areas,
wherein the plurality of photodetectors comprises at least one first photodetector having a first sensor area, the first sensor area comprises at least one property which differs from a property of a second sensor area of a second photodetector of the plurality of photodetectors,
wherein the second photodetector is arranged closer to the optical axis than the at least one first photodetector in order to reduce an optical imaging aberration of the lens arrangement,
wherein the at least one property comprises a height of the first sensor area relative to the carrier surface such that the first sensor area of the at least one first photodetector is more elevated on the carrier surface than the second sensor area of the second photodetector,
wherein the at least one first photodetector is arranged on a first surface of a spacer,
wherein the spacer is arranged with its second surface on the carrier surface,
wherein the first surface comprises a metallization layer for electrical contacting the at least one first photodetector, and
wherein the metallization layer extends from the first surface to the second surface.

16. A lidar system comprising:
a laser configured to emit electromagnetic radiation; and
the sensor device according to claim 15.

17. A vehicle comprising the lidar system according to claim 16.

* * * * *